(12) United States Patent
Park

(10) Patent No.: US 6,479,367 B2
(45) Date of Patent: Nov. 12, 2002

(54) METHOD FOR FORMING ISOLATION LAYER IN SEMICONDUCTOR DEVICE

(75) Inventor: Sang Wook Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/893,570

(22) Filed: Jun. 29, 2001

(65) Prior Publication Data

US 2002/0001917 A1 Jan. 3, 2002

(30) Foreign Application Priority Data

Jun. 30, 2000 (KR) .......................... 2000-37115

(51) Int. Cl.$^7$ ............................... H01L 21/76
(52) U.S. Cl. ................... 438/424; 438/435; 438/426; 438/437; 438/431; 438/430; 438/425
(58) Field of Search ............... 438/424, 435, 438/426, 437, 431, 430, 425

(56) References Cited

U.S. PATENT DOCUMENTS

| | | | | |
|---|---|---|---|---|
| 5,726,090 A | * | 3/1998 | Jang et al. | 438/435 |
| 5,990,537 A | * | 11/1999 | Endo et al. | 257/208 |
| 6,159,823 A | * | 12/2000 | Song et al. | 438/437 |
| 6,180,467 B1 | * | 1/2001 | Wu et al. | 438/296 |
| 6,187,651 B1 | * | 2/2001 | Oh | 438/296 |
| 6,255,194 B1 | * | 7/2001 | Hong | 438/435 |
| 6,261,908 B1 | * | 7/2001 | Hause et al. | 438/214 |
| 6,265,281 B1 | * | 7/2001 | Reinberg | 438/400 |
| 6,294,471 B1 | * | 9/2001 | Tseng | 438/692 |
| 6,329,266 B1 | * | 12/2001 | Hwang et al. | 438/424 |

* cited by examiner

Primary Examiner—Matthew Smith
Assistant Examiner—V. Yevsikov
(74) Attorney, Agent, or Firm—Birch, Stewart, Kolasch & Birch, LLP

(57) ABSTRACT

A method for forming an isolation layer in a semiconductor device, to avoid the occurrence of an angular formation phenomenon at the edge portions of the upper and lower portions of the trench during formation of a shallow trench isolation layer (STI), so that malfunction of the device and the deterioration of its performance due to a parasitic transistor and leakage current, can be prevented. Advantageously, silicon nitride films are formed at the side wall of the pad oxide film and the surface of trench silicon through a nitrogen (N+) plasma nitrification process, after a trench etching process, for formation of STI, so that the generation of a moat is inhibited and deterioration of the device is prevented. The isolation layer in a semiconductor device is formed by forming a pad oxide film in a wet oxidation process on a silicon substrate, forming a pad nitride film in a low pressure chemical vapor deposition process on the pad oxide film, forming a shallow trench by etching the pad nitride film, the pad oxide film and the silicon substrate to a predetermined depth, forming a silicon nitride film in a nitrogen plasma nitrification process on the inner wall of the trench, filling the trench where the silicon nitride film is formed with an oxide film, and planarizing the pad nitride film and the pad oxide film in a chemical mechanical polishing process so that the silicon substrate can be exposed.

19 Claims, 5 Drawing Sheets

METHOD FOR FORMING ISOLATION LAYER IN SEMICONDUCTOR DEVICE

BACKGROUND OF THE INVENTION

1. Field of the Invention

The present invention relates to a method for forming an isolation layer in a semiconductor device, and more particularly, to a method for forming an isolation layer in a semiconductor device by which occurrence of an angular formation phenomenon at the edge portions in the upper and lower portions of a trench is reduced when a shallow trench isolation layer (hereinafter referred to as STI) is formed is prevented, so that the malfunction of the device and the deterioration of properties of the device due to a parasitic transistor and leakage current can be prevented.

Also, the present invention relates to a method for forming an isolation layer in a semiconductor device whereby a silicon nitride (SiN) layer is formed on the side wall of a pad oxide film and on the surface of a silicon (Si) trench by a nitrogen (N+) plasma nitrification process after conducting a trench etching process for forming STI, so that the generation of a moat is prevented and the deterioration in performance of the device is prevented.

2. Description of the Related Art

In general, with the advance of semiconductor technology and further high speed and high integration of a semiconductor device, a need for a fine pattern increases and a highly accurate pattern value is also required. Such a trend is applied to a semiconductor isolation area occupying a large space in a semiconductor device.

Currently, a LOCOS (local oxidation of silicon) oxide film is mainly used as an isolation layer of a semiconductor device. The LOCOS type isolation layer is obtained by selectively and partially oxidizing a substrate. However, the LOCOS type isolation layer is disadvantageous because a bird's beak phenomenon occurs at the edge thereof so that area of the isolation layer increases and current leakage is generated.

The use of an STI type isolation layer having a narrow width and exhibiting a superior isolation property has been suggested. The conventional STI isolation layer forming method is shown in FIG. 1.

Referring to FIG. 1, a pad oxide film 12 serving as a buffer and a pad nitride film 14 for restricting oxidation are formed in order on a silicon substrate 10. Next, a resist pattern (not shown) for exposing an expected isolation area is formed on the pad nitride film 14. Here, the resist pattern is formed by using a DUV (deep ultraviolet) light source exhibiting a high resolution to form an isolation layer having a narrow width. Then, the pad nitride film 14, the pad oxide film 12, and the silicon substrate 10 are etched to a predetermined depth by using the resist pattern as a mask, forming a shallow trench 16. Next, the resist pattern is removed by a well-known method and the shallow trench 16 is filled with an oxide film 18. Next, the pad nitride film 14 and the pad oxide film 12 remaining on the surface of the semiconductor substrate 10 are removed by a well-known method, and thus, an STI isolation layer is completed.

FIGS. 2A through 2C are sectional views explaining problems associated with the conventional STI isolation layer forming method. FIG. 2A shows that the pad oxide film 12 is wet etched and a pad oxide film undercut 12c is generated during a cleaning process for forming the conventional STI isolation layer. However, a problem occurs in that the pad oxide film undercut 12c is not completely filled when the shallow trench 16 is filled with the insulation film 18.

FIG. 2B shows that a void 12v is generated in the insulation film 18 embedded through the pad oxide film undercut 12c of FIG. 2A. FIG. 2C shows that a moat 12m is generated due to the void 12v when the oxide film 18 is made planar in a chemical-mechanical polishing (CMP) process. In the semiconductor device where the moat 12m is generated, the thickness of a gate electrode deposited to the moat 12m selectively increases so that etch residue is generated during a gate etching process.

Also, when wall oxidation is performed in an atmosphere of oxygen ($O_2$), a very large compression stress is applied to an edge portion of the upper portion of the trench because the pad nitride film 14, the pad oxide film 12, and the silicon substrate 10 form boundary surfaces. Accordingly, the speed of diffusion of oxygen is slow and the crystallization surfaces of silicon exist differently at the edge portion of the lower portion of the trench (a trench bottom surface 100, a trench side surface 110, and a trench lower edge portion 111), so that the speeds of oxidation in a horizontal direction and a vertical direction are different from each other. As a result, an angular formation phenomenon is generated at the edge portions of the upper and lower portions of the trench. When the angular formation phenomenon is generated, a gate oxide film thinning phenomenon is induced so that a hump phenomenon (a phenomenon in which drain current irregularly varies at a certain drain voltage) is generated at a drain current and drain voltage feature of a transistor. Also, when a power voltage Vcc needed for operation of the device is applied to the gate, an electric field concentration effect, that is, the size of the electric field at the edge portion of the trench is selectively increased, is generated. Thus, leakage current increases and the GOI (gate oxide integrity) property of the device deteriorates.

SUMMARY OF THE INVENTION

To solve the above problems, it is an objective of the present invention to provide a method for forming an isolation layer in a semiconductor device wherein occurrence of the angular formation phenomenon at the edge portions of the upper and lower portions of the trench during formation of a shallow trench isolation layer, (STI) is prevented, so that malfunction of the device and deterioration of performance due to a parasitic transistor and leakage current can be prevented.

Also, it is another objective of the present invention to provide a method for forming an isolation layer in a semiconductor device wherein silicon nitride films are formed at the side wall of the pad oxide film and the surface of trench silicon through a nitrogen (N+) plasma nitrification process, after a trench etching process for formation of STI, so that generation of a moat is restricted and deterioration of the device is prevented.

Accordingly, to achieve the above objective, there is provided a method for forming an isolation layer in a semiconductor device comprising the steps of forming a pad oxide film in a wet oxidation process on a silicon substrate, forming a pad nitride film in a low pressure chemical vapor deposition process on the pad oxide film, forming a shallow trench by etching the pad nitride film, the pad oxide film and the silicon substrate to a predetermined depth, forming a silicon nitride film in a nitrogen plasma nitrification process on the inner wall of the trench, filling the trench where the silicon nitride film is formed with an oxide film, and planarizing the pad nitride film and the pad oxide film in a chemical-mechanical polishing process so that the silicon substrate can be exposed.

It is preferred in the present invention that the conditions of the pad oxide film depositing process are a process temperature of 800–900° C., a process pressure of 1–2.5 Torr, a mixing ratio of water ($H_2O$) and nitride oxide ($N_2O$) of 130–200, a sccm of 70–90 sccm, and a thickness of the pad oxide film of 50–150.

Also, it is preferred in the present invention that, in the low pressure chemical vapor deposition process, a compression stress of a boundary surface between the pad oxide film and the pad nitride film is maintained at $10^2$–$10^3$ dyne/cm or less by controlling the chemical composition ratio with $Si_3N_4$, so that a lifting phenomenon of the pad nitride film can be restricted.

Also, it is preferred in the present invention that the conditions of the pad nitride film depositing process are: a process temperature of 700–900° F., a process pressure of 2.5–4 Torr, a mixing ratio of $SiH_4$ and $N_2O$ of 120–150, a sccm of 150–180 sccm, and a thickness of the pad nitride film of 1000–13000 Å.

Also, it is preferred in the present invention that the angle between the bottom surface and side surface of the trench 35 is 80–85° C. and the depth of the trench is 1000–5000 Å.

Also, it is preferred in the present invention that etch damage accumulated during the trench etching is removed by performing a wall sacrificial oxidation process in a wet method after the trench etching process.

Also, it is preferred in the present invention that the process conditions of the wall sacrificial oxidation process performed in a wet method are a process temperature of 800–900° F., a process pressure of 1.8–4 Torr, a mixing ratio of $H_2O$ and $N_2O$ gases of 120–140, a sccm of 80–100 sccm, and a thickness of the wall sacrificial oxidation film of 50–200 Å.

Also, it is preferred in the present invention that etch damage accumulated during the trench etching is removed by performing a wall sacrificial oxidation process in a dry method after the trench etching process.

Also, it is preferred in the present invention that the process conditions of the wall sacrificial oxidation process performed in a dry method are a process temperature of 950–1050° C., a process pressure of 1.2–2.2 Torr, a mixing ratio of $N_2O$ and $O_2$ gases of 110–140, a sccm of 180–230 sccm, and a thickness of the wall sacrificial oxidation film of 50–200 Å.

Also, it is preferred in the present invention that the thickness of the silicon nitride film is 30–50 Å.

Also, it is preferred in the present invention that the conditions of the nitrogen plasma nitrification process are a process pressure of 20–30 mTorr, a high frequency (RF) electric power of 150–250 kW, a high frequency (RF) of 13.56 MHz, and a speed of flow of nitrogen ($N_2$) gas of 100–150 sccm.

Also, it is preferred in the present invention that the density of combination of a boundary surface between the silicon nitride film and the silicon substrate is controlled to be $10^2$–$10^3$ atom/cm$^3$ or less.

Also, it is preferred in the present invention that, to increase the attachment strength between the oxide film and the silicon substrate, a wall sacrificial oxidation process using a wet method is performed.

Also, it is preferred in the present invention that the process conditions of the wall sacrificial oxidation process performed in a wet method are a process temperature of 800–850° C., a process pressure of 1.2–3 Torr, a mixing ratio of $H_2O$ and $N_2O$ gases of 120–140, a sccm of 80–100 sccm, and a thickness of the wall sacrificial oxidation film of 50–200 Å.

Also, it is preferred in the present invention that, to increase the attachment strength between the oxide film and the silicon substrate, a wall sacrificial oxidation process using a dry method is performed.

Also, it is preferred in the present invention that the process conditions of the wall sacrificial oxidation process performed in the dry method are a process temperature of 900–1000° C., a process pressure of 1.8–3.3 Torr, a mixing ratio of $N_2O$ and $O_2$ gases of 120–150, a sccm of 80–110 sccm, and a thickness of a wall sacrificial oxidation film of 50–200 Å.

Also, it is preferred in the present invention that the oxide film is a high density plasma oxide film.

Also, it is preferred in the present invention that an annealing process is performed after the inside of the trench is filled with the oxide film.

Also, it is preferred in the present invention that the annealing process is performed under the conditions of a mixing ratio of nitrogen ($N_2$) and argon (Ar) of 100–140, a sccm of 100–120 sccm, a process temperature of 900–1000° C., and a process pressure of 1.5–3 Torr.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

Figure 1:
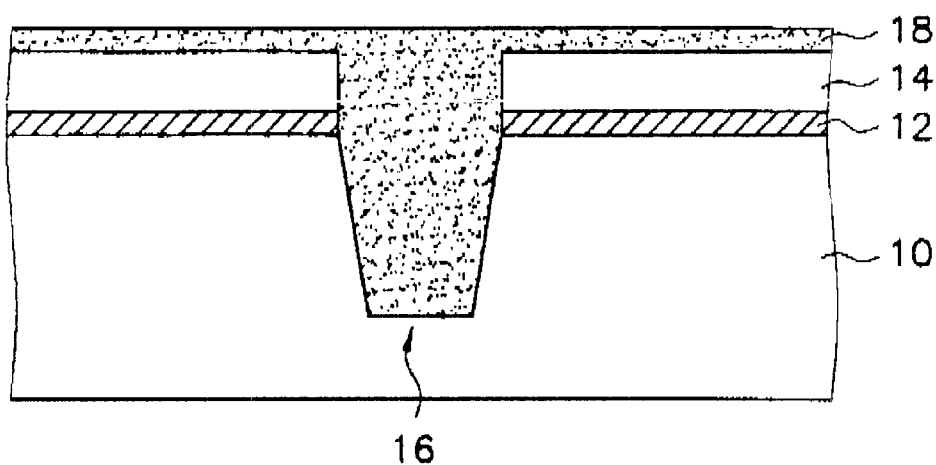
FIG. 1 is a sectional view for explaining the conventional method for forming an STI isolation layer.
Figure 2A:
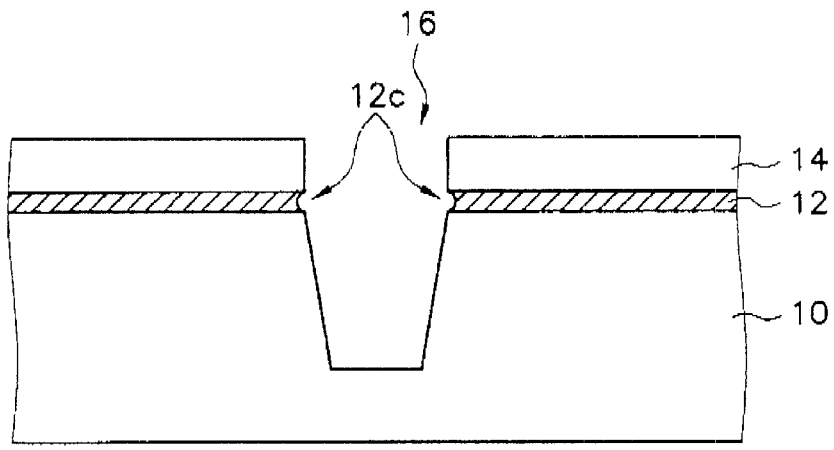
FIGS. 2A through 2C are sectional views for explaining problems in the conventional STI isolation layer forming method.
Figure 2B:
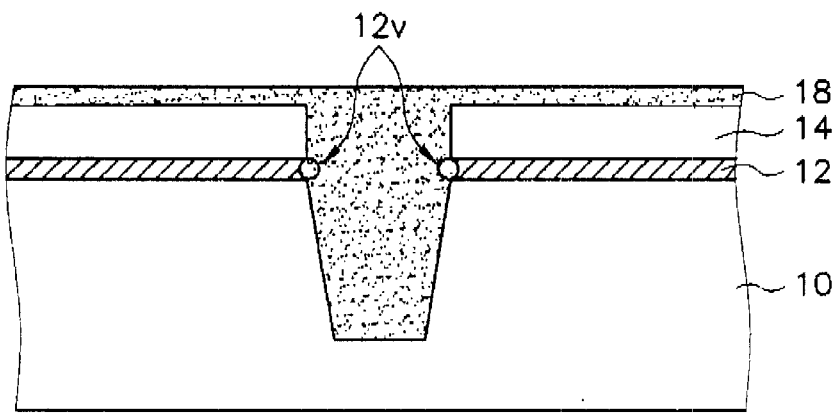
Figure 2C:
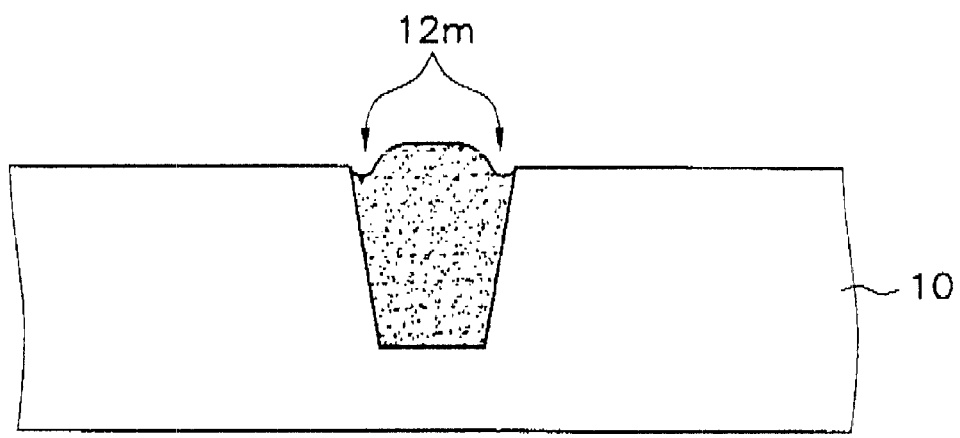
Figure 3A:
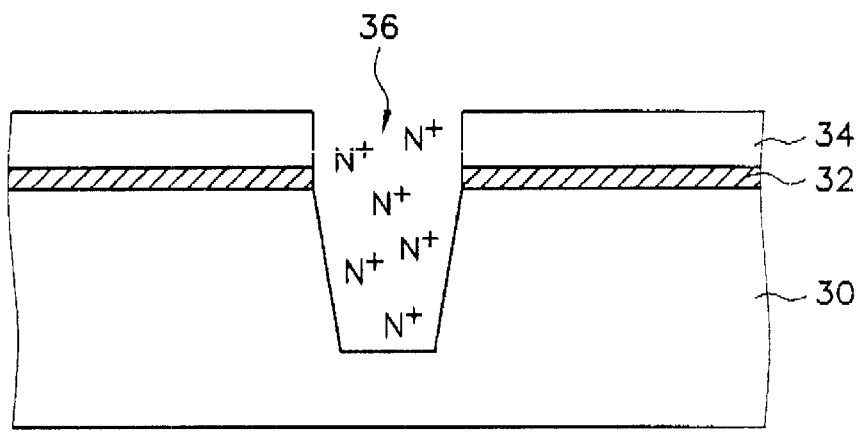
FIGS. 3A through 3C are sectional views for explaining a method for forming an STI isolation layer according to the present invention.
Figure 3B:
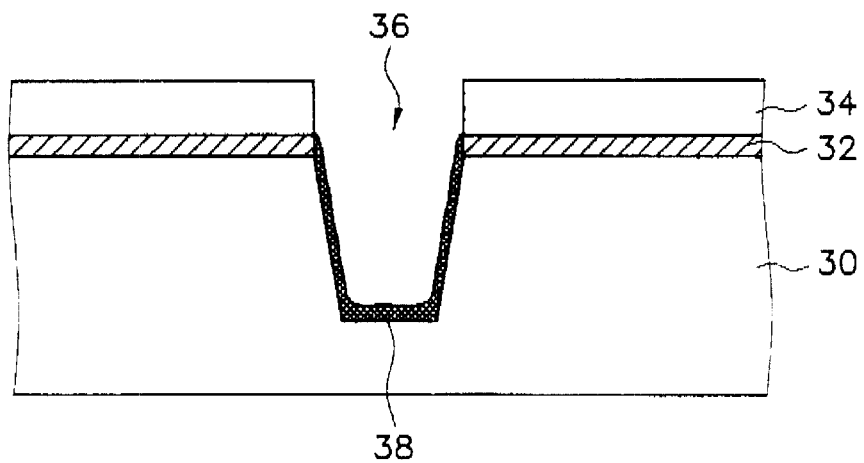
Figure 3C:
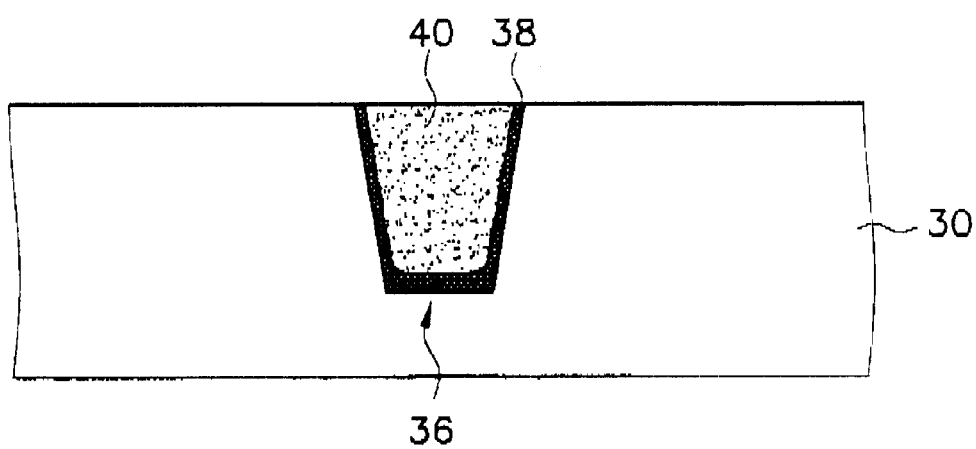

Referring to FIGS. 3A through 3C, a pad oxide film 32 serving as a buffer and a pad nitride film 34 for restricting oxidation are sequentially formed on a silicon substrate 30. Here, since the pad oxide film 32 is formed by using a wet oxidation method, the density of a point defect which may be generated at a boundary surface between the silicon substrate 30 and the pad oxide film 32 can be reduced to $10^2$–$10^3$ atom/cm$^3$ or less. Here, the conditions of the wet oxidation substrate are: a process temperature of 800–900° C., a process pressure of 1–2.5 Torr, a mixing ratio of water ($H_2O$) and nitride oxide ($N_2O$) of 130–200 sccm:70–90 sccm, and a thickness of the pad oxide film 32 of 50–150 Å.

The pad nitride film 34 is deposited by a lower pressure chemical vapor deposition (LPCVD) method using a mixed gas of $SiH_4$ and $N_2O$. Here, the compression stress of the boundary surface between the pad oxide film 32 and the pad nitride film 34 is maintained under $10^2$–$10^3$ dyne/cm by controlling the chemical composition ratio with $Si_3N_4$, so that a lifting phenomenon of the pad nitride film 34 is restricted.

The conditions of the deposition process of the pad nitride film 34 are: a process temperature of 700–900° C., a process pressure of 2.5–4 Torr, a mixing ratio of $SiH_4$ and $N_2O$ gases of 120–150 sccm:150–180 sccm, and a thickness of the pad nitride film 32 of 1000–13000 Å.

Next, a resist pattern (not shown) for exposing an expected isolation area is formed on the pad nitride film 34.

Here, the resist pattern is formed by using a DUV (deep ultraviolet) light source exhibiting a superior resolution to form a thin isolation layer. Then, the pad nitride film 34, the pad oxide film 32, and the silicon substrate 30 are etched to a predetermined depth by using the resist pattern as a mask, so that a shallow trench 36 is formed. Here, the angle between the bottom surface and side surface of the trench 35 is 80–85° and the depth of the trench is 1000–5000 Å.

To remove etch damage accumulated during the trench etching process, a wall sacrificial oxidation process is performed in a wet or dry method. When the wall sacrificial oxidation process is performed in a wet method, the process conditions are: a process temperature of 800–900° C., a process pressure of 1.8–4 Torr, a mixing ratio of $H_2O$ and $N_2O$ gases of 120–140 sccm:80–100 sccm, and a thickness of a wall sacrificial oxidation film of 50–200 Å. When the wall sacrificial oxidation process is performed in a dry method, the process conditions are: a process temperature of 950–1050° C., a process pressure of 1.2–2.2 Torr, a mixing ratio of $N_2O$ and $O_2$ gases of 110–140 sccm:180–230 sccm, and a thickness of a wall sacrificial oxidation film of 50–200 Å.

After the above process, a nitrogen (N+) plasma nitrification process is performed to form a silicon nitride (SiN) film 38 on the inner wall of the trench. Here, the thickness of the silicon nitride film 38 formed by the nitrogen plasma nitrification process is 30–50 Å. The conditions of the nitrogen plasma nitrification process are: a process pressure of 20–30 mTorr, a high frequency (RF) electric power of 150–250 kW, a high frequency (RF) frequency of 13.56 MHz, and a speed of flow of nitrogen ($N_2$) gas of 100–150 sccm.

By the nitrogen plasma nitrification process, the pad nitride film 34 undergoes a reaction as shown in Chemical Formula 1, the pad oxide film 32 undergoes a reaction as shown in Chemical Formula 2, and the silicon substrate 30 undergoes a reaction as shown in Chemical Formula 3.

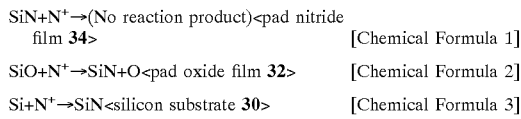

| $SiN+N^+ \rightarrow$(No reaction product)<pad nitride film 34> | [Chemical Formula 1] |
| $SiO+N^+ \rightarrow SiN+O$<pad oxide film 32> | [Chemical Formula 2] |
| $Si+N^+ \rightarrow SiN$<silicon substrate 30> | [Chemical Formula 3] |

Thus, as shown in FIG. 3B, the silicon nitride film 38 is formed on the surfaces of the pad oxide film 32 and the silicon substrate 30. As the silicon nitride film 38 is formed on the side surface of the pad oxide film 32 and the surface of the silicon substrate 30 by the nitrogen plasma nitrification process, undercut of the pad oxide film 32 is prevented so that the moat phenomenon can be prevented. Also, by the nitrogen plasma nitrification process, the silicon nitride film 38 is generated on the surface of the trench silicon so that an angled formation phenomenon at the edge portions of the upper and lower portions of the trench is restricted. Thus, leakage current of the device can be reduced to $10^{-12}$ μA or less.

The density of a point defect of a boundary surface between the silicon nitride film 38 and the silicon substrate 30 is controlled to be $10^2$–$10^3$ atom/cm$^3$ or less by generating the silicon nitride film 38 in the trench by the nitrogen plasma nitrification process. Accordingly, leakage current can be reduced under $10^{-12}$ μA. Also, an isolation breakdown voltage can be improved by 15–20% by generating the silicon nitride film 38 in the trench by the nitrogen plasma nitrification process and by using a high permittivity of the silicon nitride film 38.

The silicon nitride film 38 formed by the nitrogen plasma nitrification process prevents the undercut phenomenon of the pad oxide film 32 and restricts the moat phenomenon and the angled formation phenomenon of the edge portions of the trench. In addition, the silicon nitride film 38 exhibits a superior dielectric property, compared to the silicon oxide film $SiO_2$, and a constant insulation property in a high voltage electric field.

Next, to increase the attachment strength between an insulation film 40 filled in the trench 36 and the silicon substrate 30, a wall sacrificial oxidation process is performed in a wet or dry method. When the wall sacrificial oxidation process is performed in a wet method, the process conditions are: a process temperature of 800–850° C., a process pressure of 1.2–3 Torr, a mixing ratio of $H_2O$ and $N_2O$ gases of 120–140 sccm:80–100 sccm, and a thickness of a wall sacrificial oxidation film of 50–200 Å. When the wall sacrificial oxidation process is performed in a dry method, the process conditions are: a process temperature of 900–1000° C., a process pressure of 1.8–3.3 Torr, a mixing ratio of $N_2O$ and $O_2$ gases of 120–150 sccm:80–110 sccm, and a thickness of a wall sacrificial oxidation film of 50–200 Å.

Then, as shown in FIG. 3C, the trench 36 is filled with a high density plasma oxide (HDP oxide) film 40 exhibiting a high density and superior dielectric property. Next, an annealing process is performed under the conditions of a mixing ratio of nitrogen ($N_2$) and argon (Ar) of 100–140 sccm:100–120 sccm, a process temperature of 900–1000° C., and a process pressure of 1.5–3 Torr. Next, if needed, the pad oxide film 32 and the pad nitride film 34 above the silicon substrate 30 are planarized by post-processing using a chemical mechanical polishing (CMP) method. Thus, an STI isolation layer capable of improving a GOI of the device and the property of a transistor is completed by the above processes.

As described above, in the method for forming an isolation film in a semiconductor device according to the present invention, an angled formation phenomenon at the edge portions of the upper and lower portions of the trench during the formation of the shallow trench isolation layer is restricted so that malfunction of a device due to a parasitic transistor and leakage current and deterioration of a property of the device can be prevented. Also, the method for forming an isolation film in a semiconductor device according to the present invention since an SiN layer is formed on the side wall of the pad oxide film and the surface of the trench silicon by the nitrogen (N+) plasma nitrification process after the trench etching process to form an STI, generation of a moat is restricted so that deterioration of the properties of the device can be prevented.

It is noted that the present invention is not limited to the preferred embodiment described above, and it is apparent that variations and modifications by those skilled in the art can be effected within the spirit and scope of the present invention defined in the appended claims.

What is claimed is:

1. A method for forming an isolation layer in a semiconductor device comprising the steps of:

forming a pad oxide film in a wet oxidation process on a silicon substrate;

forming a pad nitride film by a low pressure chemical vapor deposition process on the pad oxide film;

forming a shallow trench by etching the pad nitride film, the pad oxide film and the silicon substrate to a predetermined depth;

forming a silicon nitride film, in a nitrogen plasma nitrification process, on the inner wall of the trench;

filling the trench where the silicon nitride film is formed with an oxide film; and planarizing the pad nitride film and the pad oxide film in a chemical mechanical polishing process so that the silicon substrate can be exposed.

2. The method as claimed in claim 1, wherein the pad oxide film is deposited at a process temperature of 800–900° C., a pressure of 1–2.5 Torr, a mixing ratio of water ($H_2O$) and nitride oxide ($N_2O$) of 130–200 sccm:70–90 sccm, and a thickness of the pad oxide film of 50–150 Å.

3. The method as claimed in claim 1, wherein, in the low pressure chemical vapor deposition process, a compression stress of a boundary surface between the pad oxide film and the pad nitride film is maintained at $10^2$–$10^3$ dyne/cm or less by controlling a chemical composition ratio with $Si_3N_4$, so that a lifting phenomenon of the pad nitride film can be restricted.

4. The method as claimed in claim 1, wherein the pad nitride film is deposited at a temperature of 700–900° C., a pressure of 2.5–4 Torr, a mixing ratio of $SiH_4$ and $N_2O$ of 120–150 sccm:150–180 sccm, and a thickness of the pad nitride film of 1000–13000 Å.

5. The method as claimed in claim 1, wherein the angle between the bottom surface and side surface of the trench 35 is 80–85° and the depth of the trench is 1000–5000 Å.

6. The method as claimed in claim 1, wherein the etch damage accumulated during the trench etching is removed by performing a wall sacrificial oxidation process in a wet method after the trench etching process.

7. The method as claimed in claim 6, wherein the wall sacrificial oxidation process performed in a wet method is conducted at a temperature of 800–900° C., a process pressure of 1.8–4 Torr, a mixing ratio of $H_2O$ and $N_2O$ gases of 120–140 sccm:80–100 sccm, and a thickness of the wall sacrificial oxidation film of 50–200 Å.

8. The method as claimed in claim 1, wherein etch damage accumulated during the trench etching is removed by performing the wall sacrificial oxidation process in a dry method after the trench etching process.

9. The method as claimed in claim 1, wherein the wall sacrificial oxidation process is performed in a dry method at a process temperature of 950–1050° C., a process pressure of 1.2–2.2 Torr, a mixing ratio of $N_2O$ and $O_2$ gases of 110–140 sccm:180–230 sccm, and a thickness of a wall sacrificial oxidation film of 50–200 Å.

10. The method as claimed in claim 1, wherein the thickness of the silicon nitride film is 30–50 Å.

11. The method as claimed in claim 1, wherein a nitrogen plasma nitrification process is performed at a pressure of 20–30 mTorr, a high frequency (RF) electric power of 150–250 kW, a high frequency (RF) frequency of 13.56 MHz, and a speed of flow of nitrogen ($N_2$) gas of 100–150 sccm.

12. The method as claimed in claim 1, wherein the density of the combination of a boundary surface between the silicon nitride film and the silicon substrate is controlled to be $10^2 10^3$ atom/cm$^3$ or less.

13. The method as claimed in claim 1, wherein, to increase the attachment strength between the oxide film and the silicon substrate, a wet method wall sacrificial oxidation process is performed.

14. The method as claimed in claim 13, wherein the wall sacrificial oxidation process is performed, in a wet method, at a temperature of 800–850° C., a pressure of 1.2–3 Torr, a mixing ratio of $H_2O$ and $N_2O$ gases of 120–140 sccm:80–100 sccm, and a thickness of the wall sacrificial oxidation film of 50–200 Å.

15. The method as claimed in claim 1, wherein, to increase the attachment strength between the oxide film and the silicon substrate, a wall sacrificial oxidation process using a dry method is performed.

16. The method as claimed in claim 15, wherein the process conditions of the wall sacrificial oxidation process is performed, in a dry method are, at a temperature of 900–1000° C., a process pressure of 1.8–3.3 Torr, a mixing ratio of $N_2O$ and $O_2$ gases of 120–150 sccm:80–110 sccm, and a thickness of a wall sacrificial oxidation film of 50–200 Å.

17. The method as claimed in claim 1, wherein the oxide film is a high density plasma oxide film.

18. The method as claimed in claim 1, wherein an annealing process is performed after the inside of the trench is filled with the oxide film.

19. The method as claimed in claim 18, wherein the annealing process is performed in a mixing ratio of nitrogen ($N_2$) and argon (Ar) of 100–140 sccm:100–120 sccm, a temperature of 900–1000° C., and a pressure of 1.5–3 Torr.

* * * * *